(12) United States Patent
Sekiya

(10) Patent No.: US 10,692,767 B2
(45) Date of Patent: Jun. 23, 2020

(54) WAFER PROCESSING METHOD INCLUDING CUTTING WAFER BASED ON SURFACE HEIGHT OF WAFER

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/192,209

(22) Filed: Nov. 15, 2018

(65) Prior Publication Data
US 2019/0157151 A1 May 23, 2019

(30) Foreign Application Priority Data

Nov. 21, 2017 (JP) .................................. 2017-223797

(51) Int. Cl.
| | |
|---|---|
| *H01L 21/78* | (2006.01) |
| *H01L 21/67* | (2006.01) |
| *H01L 21/66* | (2006.01) |
| *H01L 21/304* | (2006.01) |
| *H01L 21/683* | (2006.01) |

(52) U.S. Cl.
CPC .......... *H01L 21/78* (2013.01); *H01L 21/3043* (2013.01); *H01L 21/67092* (2013.01); *H01L 22/12* (2013.01); *H01L 22/20* (2013.01); *H01L 21/6833* (2013.01)

(58) Field of Classification Search
CPC ............................... H01L 21/78; H01L 22/12
See application file for complete search history.

(56) References Cited

U.S. PATENT DOCUMENTS

| | | | | |
|---|---|---|---|---|
| 2014/0073067 | A1* | 3/2014 | Uchida | ................... H01L 21/78 438/5 |
| 2016/0315011 | A1* | 10/2016 | Ogawa | .................... H01L 21/78 |
| 2016/0343614 | A1* | 11/2016 | Ogawa | ................. B23K 26/364 |

FOREIGN PATENT DOCUMENTS

JP  2015018965 A  1/2015

* cited by examiner

*Primary Examiner* — Michael Jung
(74) *Attorney, Agent, or Firm* — Greer Burns & Crain, Ltd.

(57) ABSTRACT

A wafer processing method for forming cut grooves in streets of a wafer provided with a plurality of devices includes a holding step ST1 of holding the back surface side of the wafer by a holding surface of a chuck table, a measurement step ST2 of partitioning the front surface of the wafer held by the chuck table into a plurality of regions and measuring the surface height of the streets in each of the regions, a region-basis height setting step ST3 of setting the lowest surface height in each region as the surface height of the wafer in each region, and a cutting step ST4 of forming cut grooves in the front surface of the wafer while setting, on a region basis, a tip position of a cutting blade, based on the surface height of the wafer set in the region-basis height setting step ST3.

5 Claims, 13 Drawing Sheets

WAFER PROCESSING METHOD INCLUDING CUTTING WAFER BASED ON SURFACE HEIGHT OF WAFER

BACKGROUND OF THE INVENTION

Field of the Invention

The present invention relates to a wafer processing method.

Description of the Related Art

In recent years, attendant on the trend toward finer semiconductor devices, a wafer having semiconductor devices formed on a front surface of the semiconductor substrate has been put to practical use. The wafer is formed by stacking a low-k film (low dielectric constant insulator film) formed from an inorganic film of SiOF, BSG or the like or an organic film of a parylene polymer or the like, and a functional film that forms circuits, on the front surface of a semiconductor substrate of silicon, gallium arsenide or the like. Since the low-k film is very brittle, mechanical dicing conducted using a cutting blade may cause exfoliation of the low-k film, leading to breakage of the device.

To overcome this problem, a processing technology in which only an R-shaped (round-shaped) cutting edge of a cutting blade is made to cut into the low-k film, whereby the low-k film on the streets can be removed without causing exfoliation of the low-k film, has been devised (see, for example, Japanese Patent No. 6170769). The processing method disclosed in Japanese Patent No. 6170769 may have a problem that if the cutting-in depth of the cutting blade is too deep, exfoliation of the low-k film would be generated, and if the cutting-in depth of the cutting blade is too shallow, the low-k film on the streets could not be removed sufficiently. Taking this into account, in the processing method of Japanese Patent No. 6170769, a processing is performed wherein the height of the streets where the low-k film is formed is measured at a plurality of points of the wafer, and cutting is conducted while controlling the height of the cutting blade according to the results of measurement at the plurality of points.

SUMMARY OF THE INVENTION

According to the processing method described in Japanese Patent No. 6170769, however, there may remain a problem that when various structures such as test element group (TEG) are partly formed on the streets, the height of the cutting blade would be controlled according to the height of the part where the structure such as TEG is formed, and shallow cutting would occur at the part where the structure such as TEG is formed, resulting in that the low-k film cannot be removed sufficiently. To overcome such a problem, in the processing method of Japanese Patent No. 6170769, a technique has been devised wherein the positions of the TEGs or the like are preliminarily registered, and the height of regions where the TEG or the like is not provided is measured. In this case, it is time-consuming to preliminarily register the positions where the TEGs or the like are provided; in addition, if erroneous positions are registered, accurate height measurement could not be performed, and shallow cutting would be generated.

It is therefore an object of the present invention to provide a wafer processing method by which cut grooves can be formed while restraining a layered body including a low dielectric constant insulator film from remaining on the streets, without preliminarily registering the positions of structures.

In accordance with an aspect of the present invention, there is provided a wafer processing method for forming cut grooves by a cutting blade in streets of a wafer provided on a front surface thereof with the streets and a plurality of devices, the streets formed in a grid pattern and partly formed with a structure. The wafer processing method includes a holding step of holding a back surface side of the wafer by a holding surface of a chuck table, a measurement step of partitioning the front surface of the wafer held by the chuck table into a plurality of regions and measuring surface heights of the streets in each of the regions, a region-basis height setting step of setting a lowest surface height in each region as a surface height of the wafer in each region, after the measurement step is performed, and a cutting step of forming cut grooves in the front surface of the wafer while setting, on a region basis, a tip position of the cutting blade cutting into the wafer, based on the surface height of the wafer set in the region-basis height setting step.

In the wafer processing method as above, a layered body including a low dielectric constant insulator film may be layered on the front surface of the wafer, and the streets and the devices may be formed by the layered body.

The wafer processing method according to the present invention produces an effect that at the time of forming the cut grooves, the layered body including the low dielectric constant insulator film can be restrained on the streets, without preliminarily registering the positions of the structures.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
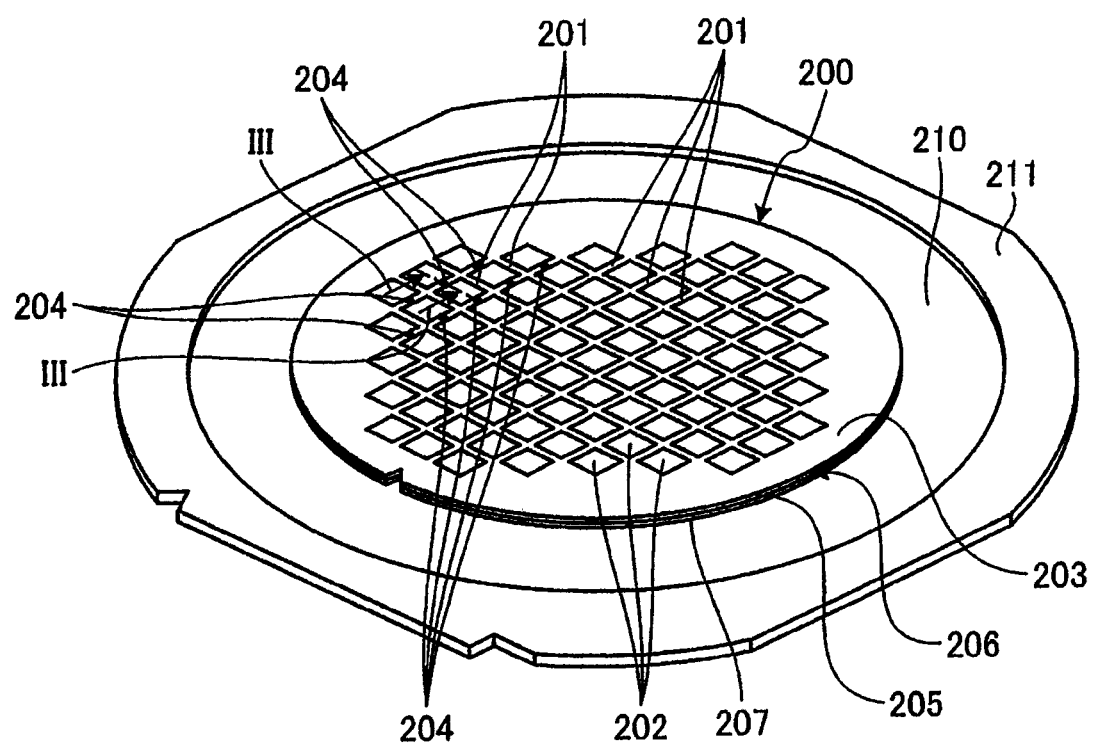
FIG. 1 is a perspective view of a workpiece to be processed by a wafer processing method according to Embodiment 1.

A mode (embodiment) for carrying out the present invention will be described in detail, referring to the drawings. The present invention is not to be limited by the contents of the description of the embodiment below. In addition, the following components include those easily conceivable by a person skilled in the art and those which are substantially the same as the original. Further, the following configurations can be combined appropriately. Besides, various omissions, replacements and modifications of configurations can be made within the scope of the gist of the present invention.

Embodiment 1

Figure 2:
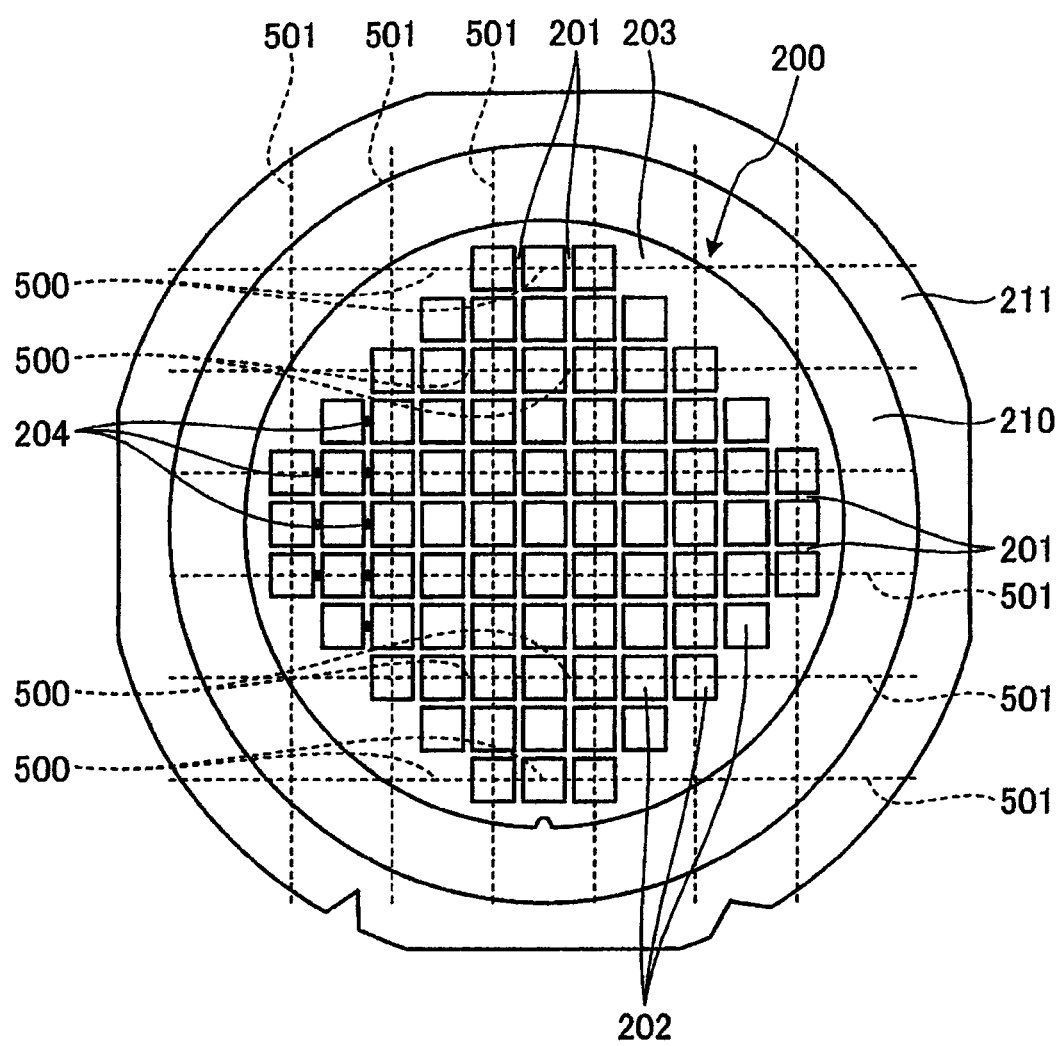
FIG. 2 is a plan view of the wafer depicted in FIG. 1.
Figure 3:
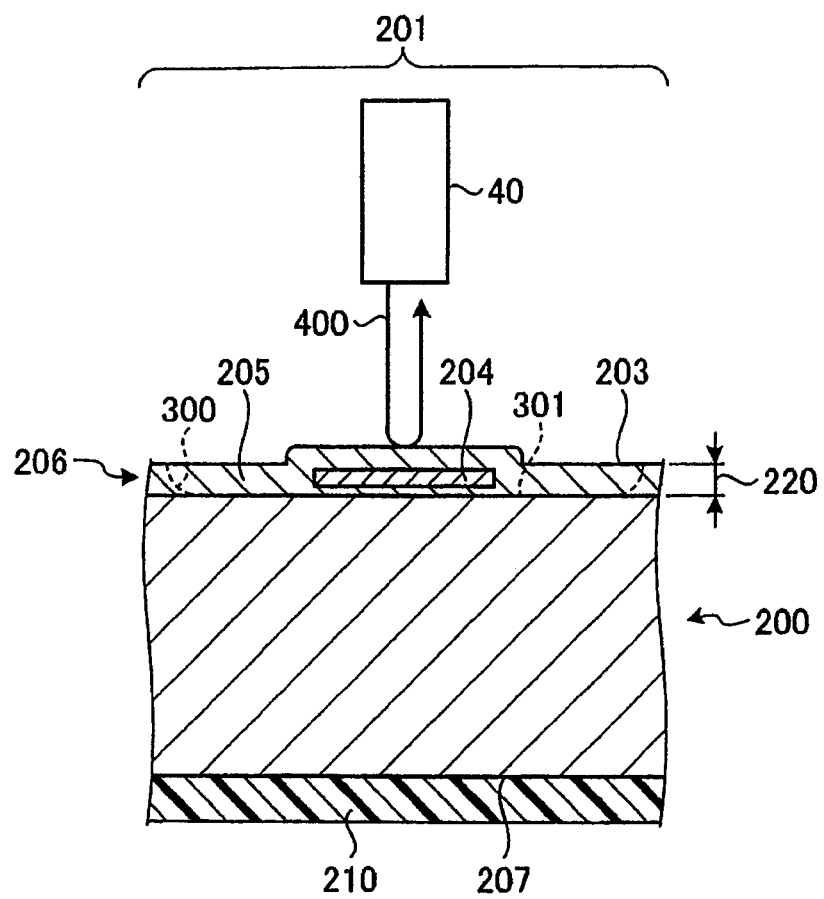
FIG. 3 is a sectional view taken along line III-III of FIG. 1.
Figure 4:
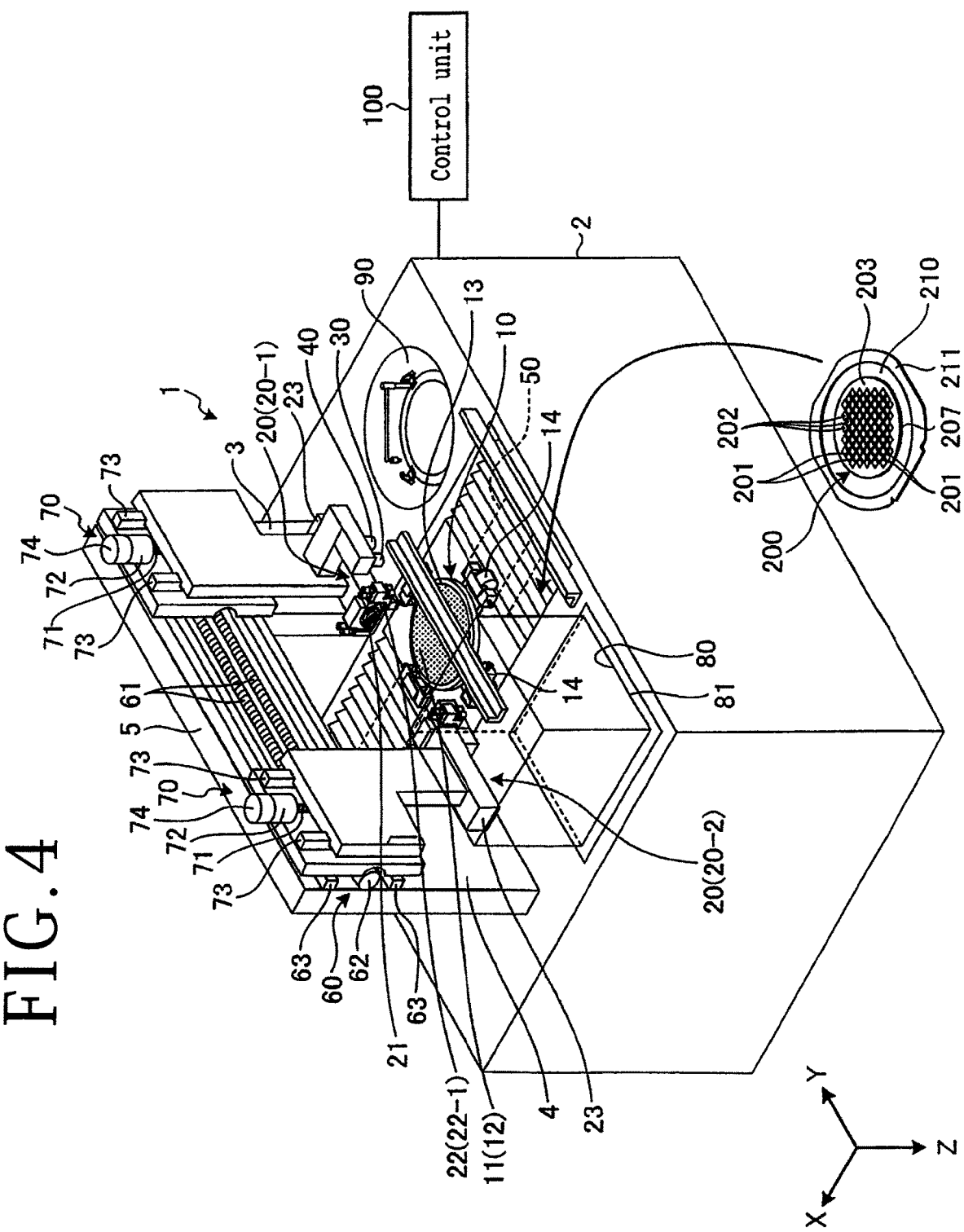
FIG. 4 is a perspective view depicting a configuration example of a cutting apparatus for carrying out the wafer processing method according to Embodiment 1.
Figure 5:
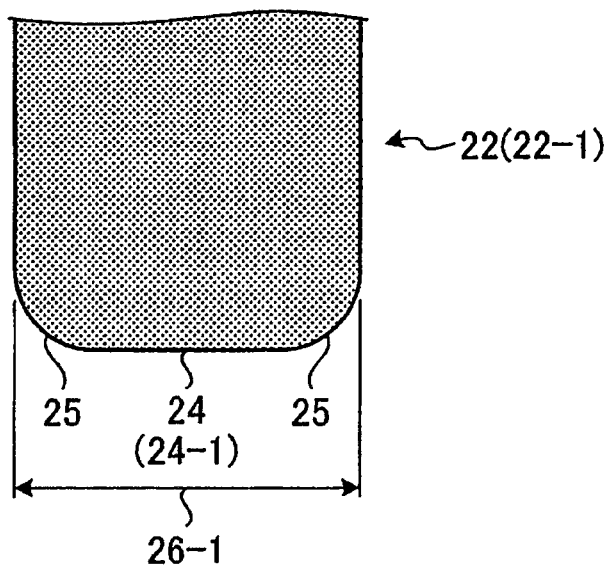
FIG. 5 is a front view of a cutting edge of a cutting blade of a cutting unit on one side of the cutting apparatus depicted in FIG. 4.
Figure 6:
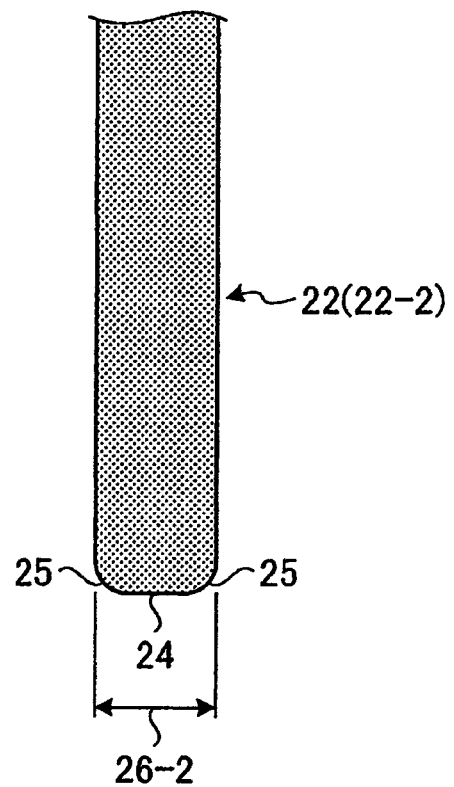
FIG. 6 is a front view of a cutting edge of a cutting blade of a cutting unit on the other side of the cutting apparatus depicted in FIG. 4.

A wafer processing method according to Embodiment 1 of the present invention will be described based on the drawings. FIG. 1 is a perspective view of a workpiece to be processed by the wafer processing method according to Embodiment 1. FIG. 2 is a plan view of the wafer depicted in FIG. 1. FIG. 3 is a sectional view taken along line III-III of FIG. 1. FIG. 4 is a perspective view depicting a configuration example of a cutting apparatus for carrying out the wafer processing method according to Embodiment 1. FIG. 5 is a front view of a cutting edge of a cutting blade of a cutting unit on one side of the cutting apparatus depicted in FIG. 4. FIG. 6 is a front view of a cutting edge of a cutting blade of a cutting unit on the other side of the cutting apparatus depicted in FIG. 4.

The wafer processing method according to Embodiment 1 is a method of cutting a wafer 200 depicted in FIGS. 1 and 2. In Embodiment 1, the wafer 200 to be processed by the wafer processing method is a circular disk-shaped semiconductor wafer or optical device wafer using a substrate formed from silicon, sapphire, gallium or the like. As depicted in FIGS. 1 and 2, the wafer 200 is provided on its front surface 203 with streets 201 formed in a grid pattern, and devices 202 provided in regions partitioned in a grid pattern by the streets 201.

The streets 201 are partly formed with test elements groups (TEGs) 204 which are structures. The TEGs 204 are evaluation elements for finding design or structural problems generated in the devices 202, and are provided at their surfaces with metallic films serving as electrode pads and electronic circuits for evaluation. The TEGs 204 are disposed arbitrarily on the basis of the kind of the wafer 200 and the like. Note that FIG. 1 depicts the TEGs 204 provided on some of the streets 201, while omitting the TEGs 204 provided on the other streets 201. In addition, while the TEGs 204 are depicted as structures in Embodiment 1, the structure partly formed on the streets 201 in the present invention is not limited to the TEGs 204.

Besides, as illustrated in FIG. 3, the wafer 200 is provided on a front surface of a substrate with a layered body 206 including a low dielectric constant insulator film (also referred to as low-k film) 205. The low dielectric constant insulator film 205 supports circuits constituting the devices 202, and has the TEGs 204 embedded therein, as depicted in FIG. 3. In Embodiment 1, the layered body 206 is layered over the streets 201 and the regions in which the devices 202 are provided. Therefore, the wafer 200 is formed with the streets 201 and the devices 202 by the layered body 206. The low dielectric constant insulator film 205 is composed of an inorganic material film of SiOF, BSG (SiOB) or the like, or an organic material film which is a polyimide, parylene or the like polymer film.

In Embodiment 1, as illustrated in FIGS. 1 and 2, a dicing tape 210 is adhered to a back surface 207 of the wafer 200, and an annular frame 211 is adhered to an outer periphery of the dicing tape 210, and, in this state of being united with the annular frame 211, the wafer 200 is formed with cut grooves 300 (indicated by dotted line in FIG. 3) in the streets 201 by a cutting blade 22 of a cutting apparatus 1 depicted in FIG. 4.

The cutting apparatus 1 illustrated in FIG. 4 is an apparatus by which the cut grooves 300 that expose the substrate to the front surface 203 side are formed along the streets 201 by the cutting blade 22, without exfoliating the low dielectric constant insulator film 205 from the substrate. In addition, in Embodiment 1, the cutting apparatus 1 is also an apparatus for dividing the wafer 200 into individual devices 202 after the formation of the cut grooves 300, but, in the present invention, the wafer 200 may not be divided into the individual devices 202 by the cutting apparatus 1. Note that in Embodiment 1 as follows, an example wherein the cut grooves 300 are formed by removing the layered body 206 including the low dielectric constant insulator film 205 on the substrate is described, but, in the present invention, the cut grooves 300 may be formed by causing the cutting blade 22 to cut into a surface layer of the substrate. As depicted in FIG. 4, the cutting apparatus 1 includes a chuck table 10 adapted to suction hold the back surface 207 side of the wafer 200 by the holding surface 11, a cutting unit 20 having the cutting blade 22 which is mounted to a spindle 21 and cuts the wafer 200 held by the chuck table 10, an imaging unit 30 adapted to image the wafer 200 held by the chuck table 10, a measurement unit 40, and a control unit 100.

Besides, as depicted in FIG. 4, the cutting apparatus 1 includes at least: an X-axis moving unit 50 adapted to put the chuck table 10 into processing feeding in an X-axis direction parallel to a horizontal direction; a Y-axis moving unit 60 adapted to put the cutting unit 20 into indexing feeding in a Y-axis direction parallel to a horizontal direction and orthogonal to the X-axis direction; and a Z-axis moving unit 70 adapted to put the cutting unit 20 into cutting-in feeding in a Z-axis direction orthogonal to the X-axis direction and the Y-axis direction and parallel to the vertical direction. As illustrated in FIG. 4, the cutting apparatus 1 is a so-called facing dual type cutting apparatus, or a two-spindle dicer, which has two cutting units 20.

The chuck table 10 is circular disk-like in shape, and includes a holding section 12 provided with a holding surface 11 for holding the wafer 200 and formed from a porous ceramic, and an annular frame section 13 surrounding the holding section 12. In addition, the chuck table 10 is provided to be movable in the X-axis direction by the X-axis moving unit 50, and to be rotatable around an axis parallel to the Z-axis direction by a rotational drive source (not depicted). The chuck table 10 is connected to a vacuum suction source (not depicted), and, by being sucked by the vacuum suction source, holds the wafer 200 by suction. Besides, a plurality of clamp sections 14 for clamping the annular frame 211 are provided in the periphery of the chuck table 10.

The cutting units 20 each have the spindle 21 on which to mount the cutting blade 22 adapted to cut the wafer 200 held by the chuck table 10. Each of the cutting units 20 is provided to be movable in the Y-axis direction by the Y-axis moving unit 60, and to be movable in the Z-axis direction by the Z-axis moving unit 70, in relation to the wafer 200 held by the chuck table 10.

As illustrated in FIG. 4, the cutting unit 20 on one side (this cutting unit will hereinafter be denoted by reference symbol 20-1) is provided on a column section 3 on one side which rises from an apparatus main body 2, through the Y-axis moving unit 60, the Z-axis moving unit 70 and the like. As depicted in FIG. 4, the cutting unit 20 on the other side (this cutting unit will hereinafter be denoted by reference symbol 20-2) is provided on a column section 4 on the other side which rises from the apparatus main body 2, through the Y-axis moving unit 60, the Z-axis moving unit 70 and the like. Note that the column sections 3 and 4 have their upper ends connected by a horizontal beam 5. Note that herein the two cutting units 20 are denoted by reference symbols 20-1 and 20-2 when they are to be distinguished from each other, and the two cutting units 20 are denoted by reference symbol 20 when they are not to be distinguished from each other. In addition, herein, the corresponding components of the two cutting units 20 are denoted by reference symbols accompanied by "–1" or "–2" when they are to be distinguished from each other.

The cutting unit 20 is configured such that the cutting blade 22 can be positioned at an arbitrary position of the holding surface 11 of the chuck table 10 by the Y-axis moving unit 60 and the Z-axis moving unit 70. The cutting blade 22 is an extremely thin cutting grindstone having a substantially annular shape. The wafer 200 is cut by rotating the cutting blade 22. The spindle 21 is rotatably accommodated in a spindle housing 23, which is supported by the Z-axis moving unit 70. The axes of the spindle 21 and the cutting blade 22 of the cutting unit 20 are set parallel to the Y-axis direction. While the cutting unit 20 is put into indexing feeding in the Y-direction by the Y-axis moving unit 60 and into cutting-in feeding in the Z-direction by the Z-axis moving unit 70, the chuck table 10 is put into cutting feeding in the X-axis direction by the X-axis moving unit 50, whereby the wafer 200 is cut by the cutting unit 20.

Note that in the cutting apparatus 1 of Embodiment 1, as depicted in FIGS. 5 and 6, cutting edges 24 of the cutting blades 22-1 and 22-2 of the cutting units 20-1 and 20-2 have corner portions 25 formed in an arcuate (R or round) shape. On the other hand, the width 26-1 of the cutting blade 22-1 of the cutting unit 20-1 on one side is formed to be thicker than the width 26-2 of the cutting blade 22-2 of the cutting unit 20-2 on the other side. In Embodiment 1, the cutting apparatus 1 causes the cutting blade 22-1 of the cutting unit 20-1 on one side to cut into the low dielectric constant insulator film 205 on the streets 201, to form the cut grooves 300 which expose the front surface of the substrate. The cutting apparatus 1 causes the cutting blade 22-2 of the cutting unit 20-2 on the other side to cut into groove bottoms 301 of the cut grooves 300, to divide the wafer 200 into the devices 202.

The X-axis moving unit 50 is a moving unit for relatively moving the chuck table 10 and the cutting unit 20 in the X-axis direction, by moving the chuck table 10 in the X-axis direction. The Y-axis moving unit 60 is a moving unit for relatively moving the chuck table 10 and the cutting unit 20 in the Y-axis direction, by moving the cutting unit 20 in the Y-axis direction. The Z-axis moving unit 70 is a unit for relatively moving the chuck table 10 and the cutting unit 20 in the Z-axis direction, by moving the cutting unit 20 in the Z-axis direction. The X-axis moving unit 50, the Y-axis moving unit 60 and the Z-axis moving unit 70 include known ball screws 61 and 71 provided to be rotatable around axes, known pulse motors 62 and 72 that rotate the ball screws 61 and 71 around the axes, and known guide rails 63 and 73 that support the chuck table 10 or the cutting unit 20 in such a manner as to be movable in the X-axis direction, the Y-axis direction or the Z-axis direction.

In addition, the cutting apparatus 1 includes an X-axis direction position detection unit (not depicted) for detecting the X-axis directional position of the chuck table 10, Y-axis direction position detection units (not depicted) for detecting the Y-axis directional positions of the cutting units 20, and Z-axis direction position detection units 74 for detecting the Z-axis directional positions of the cutting units 20. The X-axis direction position detection unit and the Y-axis direction position detection unit can each be configured by a linear scale parallel to the X-axis direction or the Y-axis direction, and a reading head which is provided to be movable in the X-axis direction or the Y-axis direction together with the chuck table 10 or the cutting unit 20 and which reads the linear scale. The Z-axis direction position detection unit 74 detects the Z-axis directional position of the cutting unit 20 by pulses of the pulse motor 72. The X-axis direction position detection unit, the Y-axis direction position detection unit and the Z-axis direction position detection unit output the X-axis directional position of the chuck table 10, the Y-axis directional position of the cutting unit 20 or the Z-axis directional position of the cutting unit 20 to the control unit 100.

The imaging unit 30 is fixed to the spindle housing 23-1 of the cutting unit 20-1 on the one side such as to be moved together with the cutting unit 20-1 on the one side. The imaging unit 30 has a charge coupled device (CCD) camera for imaging a region to be divided of the wafer 200 yet to be cut which is held by the chuck table 10. The CCD camera images the wafer 200 held by the chuck table 10, to obtain an image or the like for performing alignment between the wafer 200 and the cutting blade 22, and outputs the image or the like to the control unit 100.

The measurement unit 40 is fixed to the spindle housing 23-1 of the cutting unit 20-1 on the one side such as to be moved together with the cutting unit 20-1 on the one side, and is disposed at a position where it is aligned with the imaging unit 30 in the Y-axis direction. The measurement unit 40 applies a measurement laser beam 400 depicted in FIG. 3 toward the front surface 203 of the wafer 200 held by the chuck table 10. The measurement unit 40 receives reflected light reflected by the front surface 203 of the wafer 200 held on the holding surface 11, to measure the distance to the front surface 203 of the wafer 200. By measuring the distance to the front surface 203 of the wafer 200, the measurement unit 40 measures the surface height of the wafer 200 held by the chuck table 10. Note that in the present invention, the surface height is a Z-axis directional position with the holding surface 11 as a reference (0 μm). In Embodiment 1, the measurement unit 40 is a laser displacement gauge for detecting the Z-axis directional position of the front surface 203 of the wafer 200 with the holding surface 11 as a reference. The measurement unit 40 outputs the measurement result to the control unit 100. Note that while the measurement unit 40 is a laser displacement gauge in Embodiment 1, the measurement unit 40 in the present invention is not limited to the laser displacement gauge, but may be an optical interferometer having an interference objective lens, or the like. Note that while the surface height is defined with the holding surface 11 as a reference in Embodiment 1, the position as a reference in the present invention is not restricted to the holding surface 11, but may be any position of which Z-axis directional distance from the holding surface 11 is preliminarily set.

In addition, the cutting apparatus 1 includes a cassette elevator 80 on which a cassette 81 for accommodating the wafers 200 before and after cutting is placed and which moves the cassette 81 in the Z-axis direction, a cleaning unit 90 for cleaning the wafer 200 after cutting, and a carrying unit (not depicted) by which the wafer 200 is carried between the cassette 81, the chuck table 10, and the cleaning unit 90.

The control unit 100 controls each component of the cutting apparatus 1, to cause the cutting apparatus 1 to perform a processing operation for the wafer 200. Note that the control unit 100 is a computer. The control unit 100 includes an arithmetic processing apparatus having a microprocessor such as a central processing unit (CPU), a storage apparatus having a memory such as a read only memory (ROM) or a random access memory (RAM), and an input/output interface apparatus. The arithmetic processing apparatus of the control unit 100 carries out arithmetic processing according to a computer program stored in the storage apparatus, and outputs control signals for controlling the cutting apparatus 1 to the components of the cutting apparatus 1 through the input/output interface apparatus. Besides, the control unit 100 is connected to a display unit (not depicted) including a liquid crystal display apparatus or the like for displaying the state of a processing operation, an image or the like, and an input unit (not depicted) which is used at the time when an operator registers information on the contents of processing or the like. The input unit includes at least one of a touch panel provided on the display unit and an external input apparatus such as a keyboard.

The control unit 100 causes the imaging unit 30 to image the wafer 200 before cutting of the wafer 200, and performs alignment between the wafer 200 and the cutting blade 22 on the basis of the image obtained by the imaging by the imaging unit 30. In addition, the control unit 100 preliminarily stores a reference position in the Z-axis direction of the cutting unit 20 where the lower end of the cutting edge 24 of the cutting blade 22 is located on the same plane as the holding surface 11, and a thickness 220 (depicted in FIG. 3) of the layered body 206 at that part of the street 201 at which the TEG 204 is not formed. Note that while the reference position is the position on the same plane as the holding surface 11 in Embodiment 1, the reference position in the present invention is not limited to this position, but may be any position of which the Z-axis directional distance from the holding surface 11 is preliminarily set.

In addition, the control unit 100 preliminarily stores positions, relative to the wafer 200, of partition lines 501 by which the front surface 203 of the wafer 200 is partitioned into a plurality of regions 500 (depicted in FIG. 2). The control unit 100 causes the measurement unit 40 to measure the distance to the street 201 of the wafer 200, on the basis of a predetermined interval, while relatively moving each street 201 and the measurement unit 40 before cutting of the wafer 200, and calculates the surface height of each street 201, on the basis of a predetermined interval, from the results of detection by the Z-axis direction position detection unit 74, the reference position, and the like. The control unit 100 determines the lowest surface height in each region 500. The control unit 100 forms the cut groove 300 of each street 201 by the cutting unit 20-1 on the one side, while controlling the Z-axis directional position of the cutting unit 20-1 on the one side to such a position that the layered body 206 on the street 201 can be removed by the cutting blade 22-1, based on the lowest surface height of each region 500 and the thickness 220 of the layered body 206 and the like.

Figure 7:
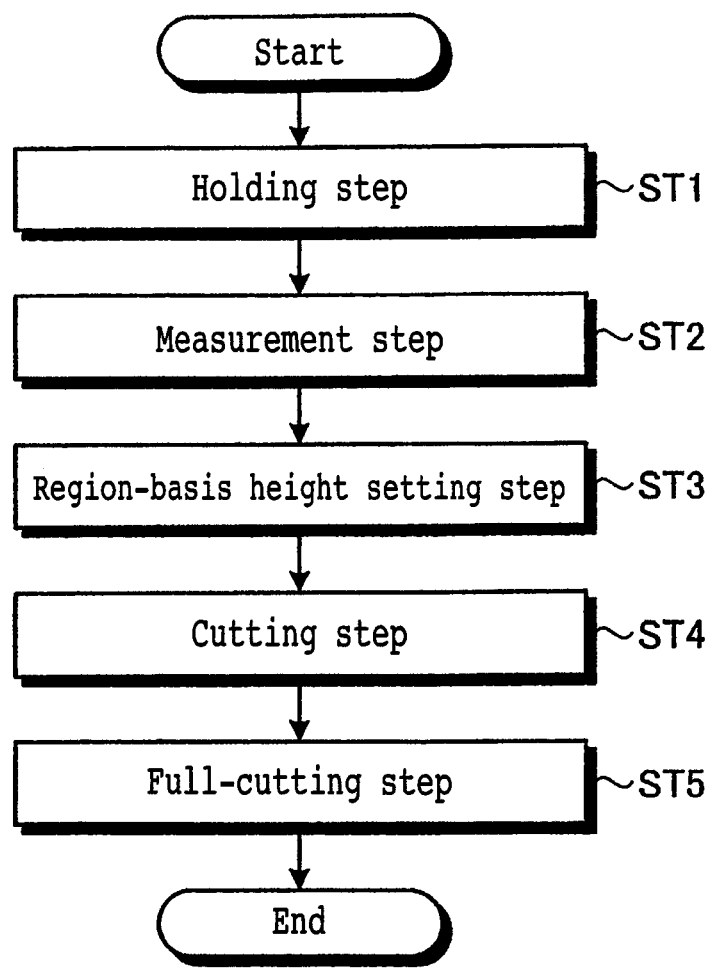
FIG. 7 is a flow chart depicting a flow of the wafer processing method according to Embodiment 1.

The wafer processing method according to Embodiment 1, or a processing operation of the cutting apparatus 1, will be described below. FIG. 7 is a flow chart depicting a flow of the wafer processing method according to Embodiment 1.

The wafer processing method according to Embodiment 1 is a method of forming the streets 201 of the wafer 200 with the cut grooves 300 which expose the front surface of the substrate. The wafer processing method according to Embodiment 1, or the processing operation of the cutting apparatus 1, is started when the information on the contents of processing is registered on the control unit 100 by the operator, the cassette 81 accommodating the wafers 200 yet to be cut is placed on the cassette elevator 80, and an instruction to start a processing operation is given from the operator. As illustrated in FIG. 7, the wafer processing method according to Embodiment 1 includes a holding step ST1, a measurement step ST2, a region-basis height setting step ST3, a cutting step ST4, and a full-cutting step ST5.

<Holding Step>

The holding step ST1 is a step of holding the back surface 207 side of the wafer 200 by the holding surface 11 of the chuck table 10. When the processing operation is started, the holding step ST1 is conducted wherein the control unit 100 causes the carrying unit to take out the wafer 200 yet to be cut from the cassette 81, causes the back surface 207 side of the wafer 200 to be held on the holding surface 11 of the chuck table 10 through the dicing tape 210, suction holds the wafer 200 by the holding surface 11 of the chuck table 10, and causes the clamp sections 14 to clamp the annular frame 211.

The control unit 100 moves the chuck table 10 toward a position under the cutting unit 20 by the X-axis moving unit 50, to position the wafer 200 held by the chuck table 10 under the imaging unit 30, and causes the imaging unit 30 to image the wafer 200. The control unit 100 performs alignment, based on the image obtained by the imaging by the imaging unit 30. The control unit 100 advances the processing to the measurement step ST2.

<Measurement Step>

Figure 8:
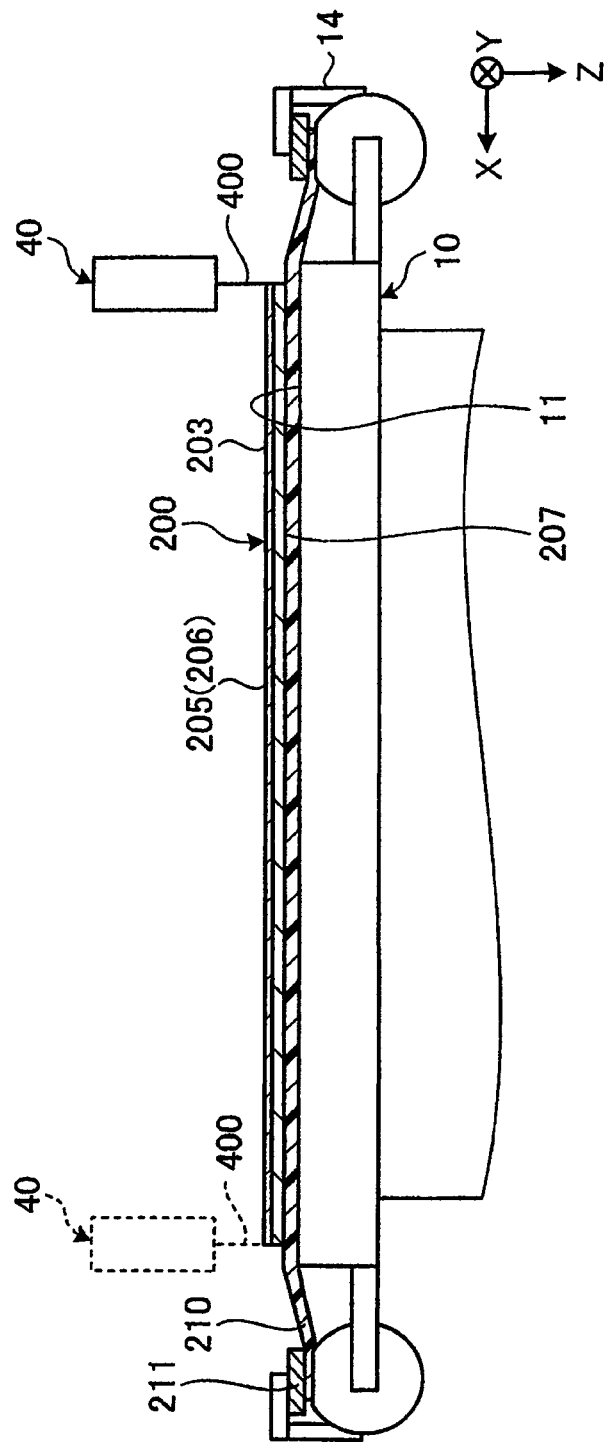
FIG. 8 is a side sectional view depicting a measurement step of the wafer processing method illustrated in FIG. 7.
Figure 9:
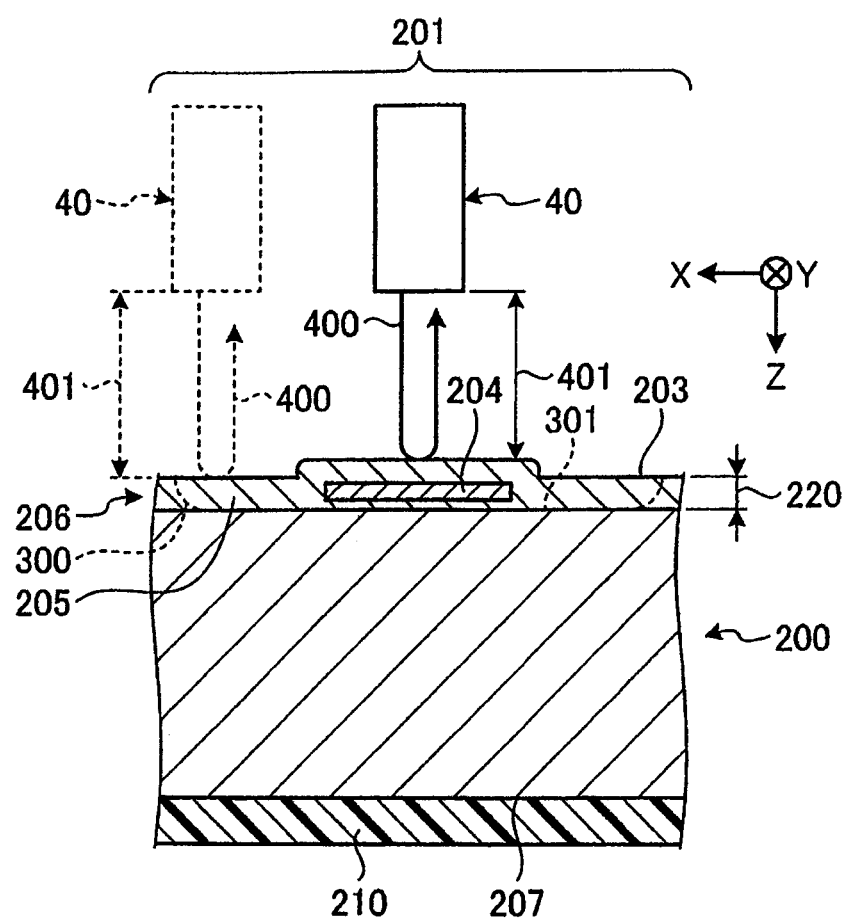
FIG. 9 is a side sectional view depicting part of the wafer illustrated in FIG. 8.
Figure 10:
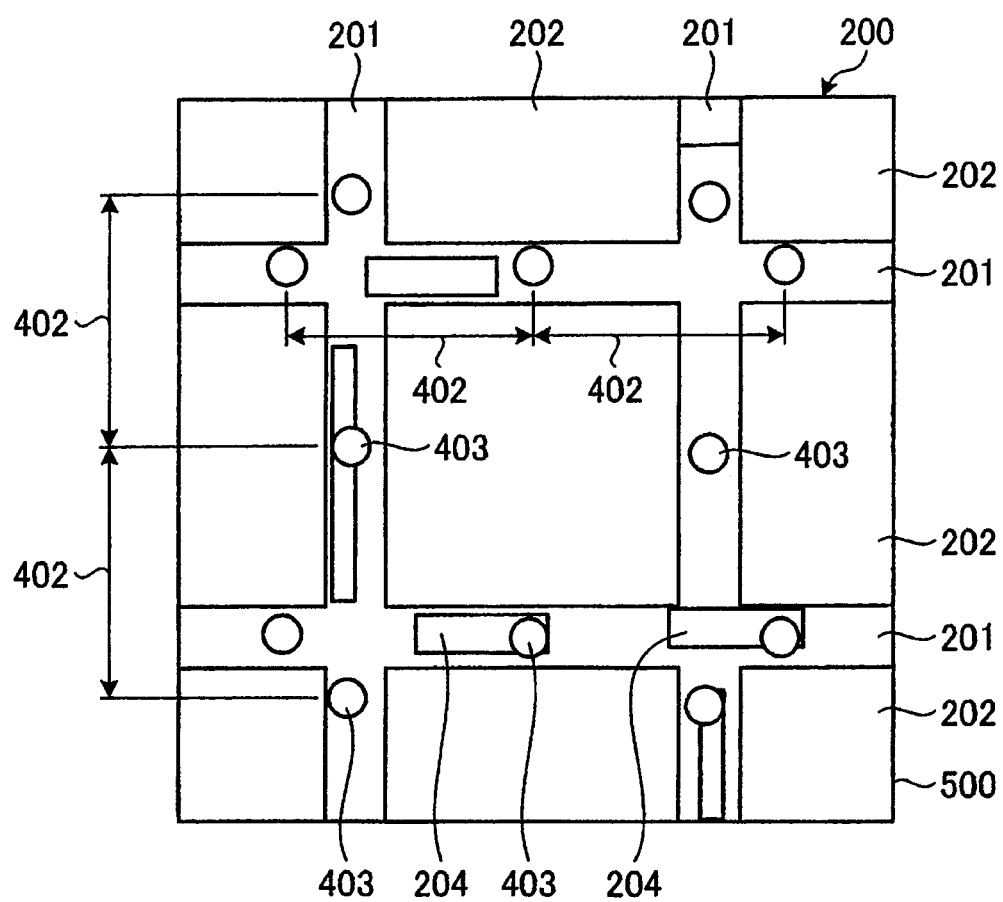
FIG. 10 is a plan view depicting measurement positions in one region in the measurement step illustrated in FIG. 7.

FIG. 8 is a side sectional view depicting the measurement step in the wafer processing method illustrated in FIG. 7. FIG. 9 is a side sectional view depicting part of the wafer depicted in FIG. 8. FIG. 10 is a plan view depicting measurement positions for one region in the measurement step illustrated in FIG. 7.

The measurement step ST2 is a step of partitioning the front surface 203 of the wafer 200 held by the chuck table 10 into a plurality of regions 500, and measuring the surface height of the streets 201 in each region 500. In the measurement step ST2, the control unit 100 partitions the front surface 203 of the wafer 200 into the plurality of regions 500, as depicted in FIG. 2, based on the alignment results and preliminarily stored positions of the partition lines 501 and the like. In the measurement step ST2, the control unit 100 causes the measurement unit 40 to measure the distance 401 (depicted in FIG. 9) to the front surface side of the street 201 on the basis of a predetermined interval 402 depicted in FIG. 10, while relatively moving the street 201 and the measurement unit 40 along the street 201 over a range between the position indicated by dotted line and the position indicated by solid line in FIG. 8.

Note that in Embodiment 1, the TEGs 204 are provided on part of the streets 201, and, therefore, as illustrated in FIG. 9, the distance 401 from the measurement unit 40 to the front surface side of the street 201 is shorter at the position where the TEG 204 is provided than at the position where the TEG 204 is not provided. In addition, circle marks in FIG. 10 indicate measurement positions 403 of the measurement unit 40.

In the measurement step ST2, the control unit 100 calculates the surface heights of the streets 201, on the basis of the predetermined interval 402, from the measurement results of the measurement unit 40 and the detection results of the Z-axis direction position detection unit 74, and the like, and stores the calculated surface heights in correspondence with the regions 500. After calculating the surface heights on the basis of the predetermined interval 402 for all the streets 201 and storing the calculated surface heights in correspondence with the regions 500, the control unit 100 advances the processing to the region-basis height setting step ST3. Note that the surface heights on the basis of the predetermined interval 402 of the streets 201 taken in correspondence with the regions 500 are surface heights of the streets 201 at a plurality of measurement positions 403 contained in each region 500; since one region 500 contains the plurality of measurement positions 403, therefore, the surface heights of a plurality of streets 201 correspond to one region 500.

<Region-Basis Height Setting Step>

The region-basis height setting step ST3 is a step of setting the lowest surface height in each region 500 as a surface height of the wafer 200 in each region 500, after the measurement step ST2 is performed. In the region-basis height setting step ST3, the control unit 100 extracts the lowest surface height from the surface heights of a plurality of streets 201 taken in correspondence with each region 500 in the measurement step ST2. In the region-basis height setting step ST3, the control unit 100 sets the surface height of the lowest street 201 as a surface height of each region 500, and stores it. After setting the surface heights for all regions 500, the control unit 100 advances the processing to the cutting step ST4.

<Cutting Step>

Figure 11:
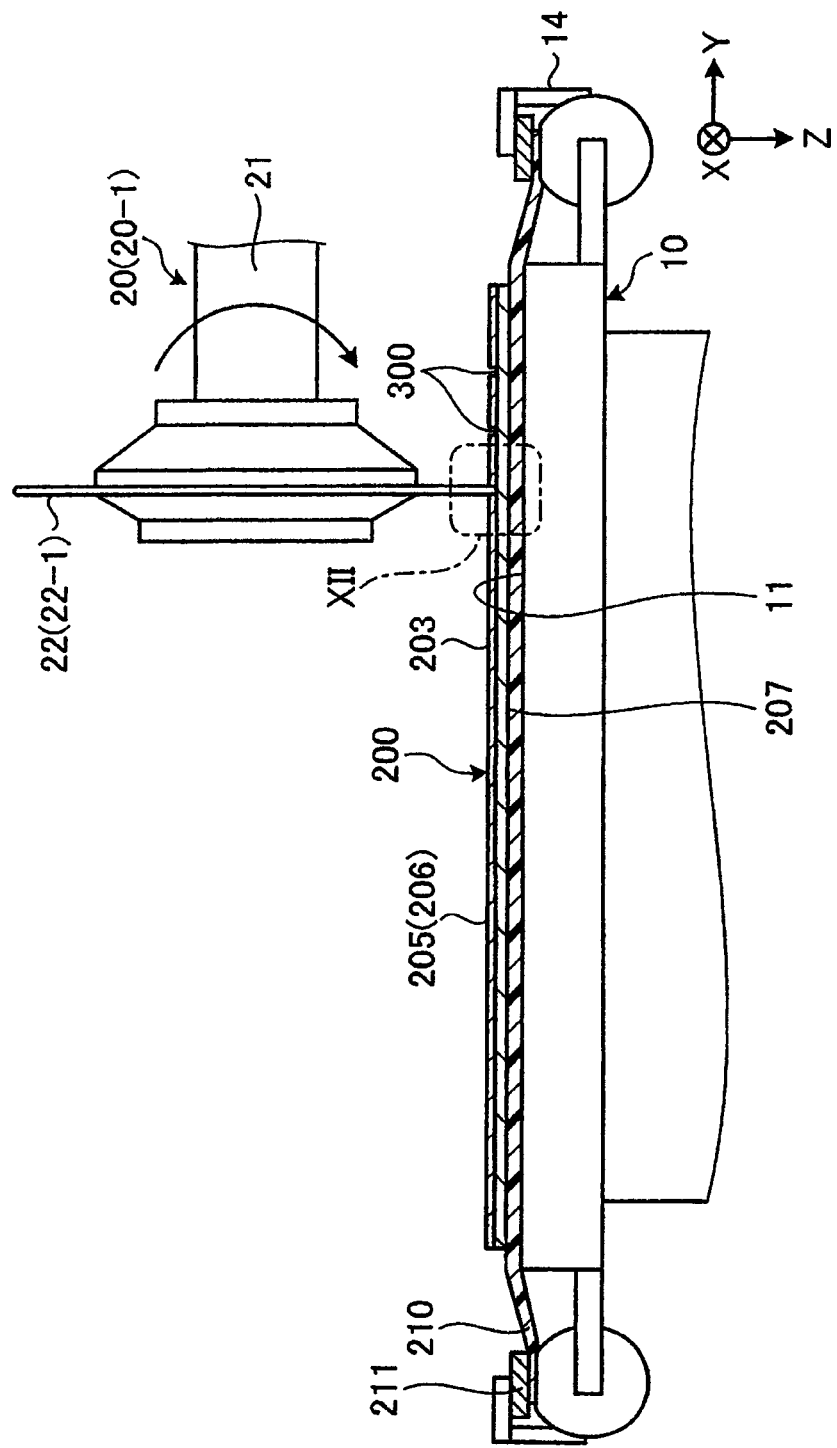
FIG. 11 is a side sectional view depicting a cutting step of the wafer processing method illustrated in FIG. 7.
Figure 12:
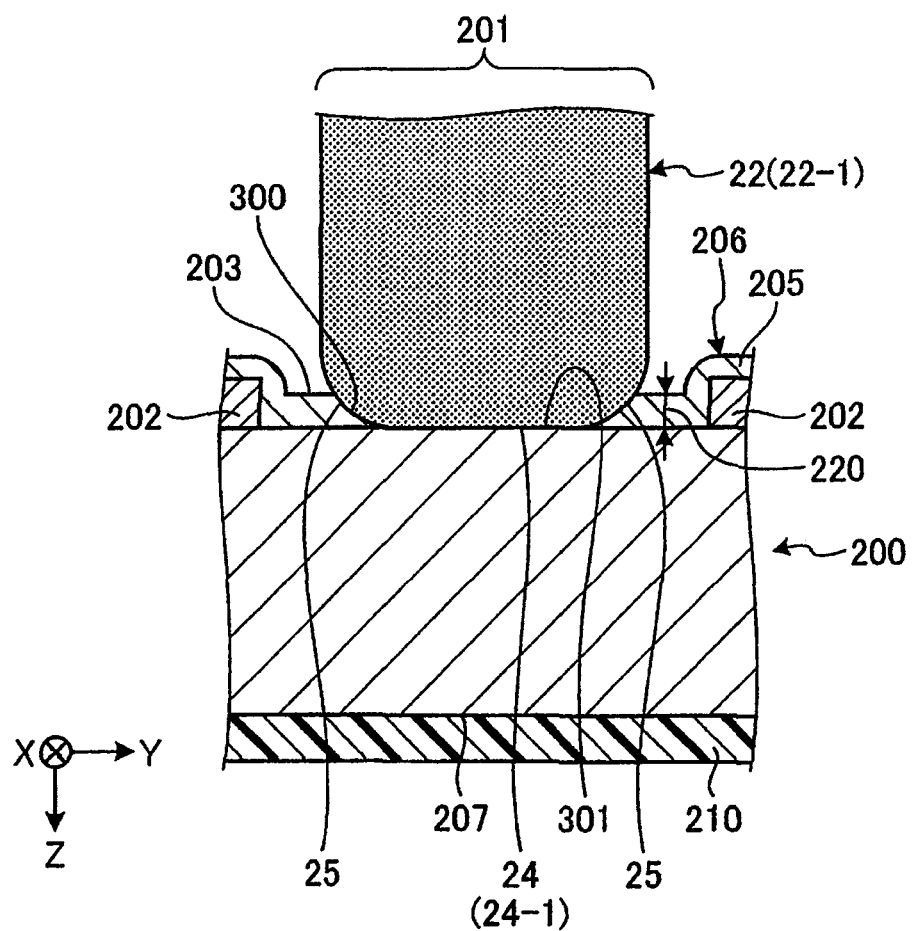
FIG. 12 is a side sectional view depicting, in an enlarged form, part XII of FIG. 11.

FIG. 11 is a side sectional view depicting the cutting step in the wafer processing method illustrated in FIG. 7. FIG. 12 is a side sectional view depicting, in an enlarged form, part XII of FIG. 11.

The cutting step ST4 is a step of forming cut grooves 300 in the front surface 203 of the wafer 200, while setting the position of the lower end of the cutting edge 24-1, which is the position of the tip of the cutting blade 22-1 cutting into the wafer 200, on the basis of each region 500, based on the surface heights of the streets 201 of the wafer 200 in each region 500 set in the region-basis height setting step ST3. In the cutting step ST4, the control unit 100 calculates Z-axis directional positions of the cutting unit 20-1 such that the substrate surfaces of the streets 201 can be exposed, on the basis of each region 500, from the surface height of each region 500 set in the region-basis height setting step ST3, the thickness 220 of the layered body 206 mentioned above, the reference position, and the like, and stores the calculated positions.

In the cutting step ST4, the control unit 100 causes the cutting blade 22-1 to cut into the layered body 206 on the streets 201 as depicted in FIGS. 11 and 12, to form the cut grooves 300, by relatively moving the streets 201 and the cutting blade 22-1 along the streets 201, based on the results of alignment, while controlling the Z-axis directional position of the cutting unit 20-1 to the aforementioned Z-axis directional position of the cutting unit 20-1 such that the substrate surface of the street 201 can be exposed. After the cut grooves 300 are formed in all the streets 201, the control unit 100 advances the processing to the full-cutting step ST5. Thus, in the cutting step ST4, the control unit 100 moves the cutting unit 20-1 in the Z-axis direction in such a manner that the cutting unit 20-1 is positioned at the Z-axis directional positions such that the substrate surfaces of the streets 201 can be exposed, which are calculated on the basis of each region 500, while relatively moving the streets 201 and the cutting blade 22-1 along the streets 201.

<Full-Cutting Step>

Figure 13:
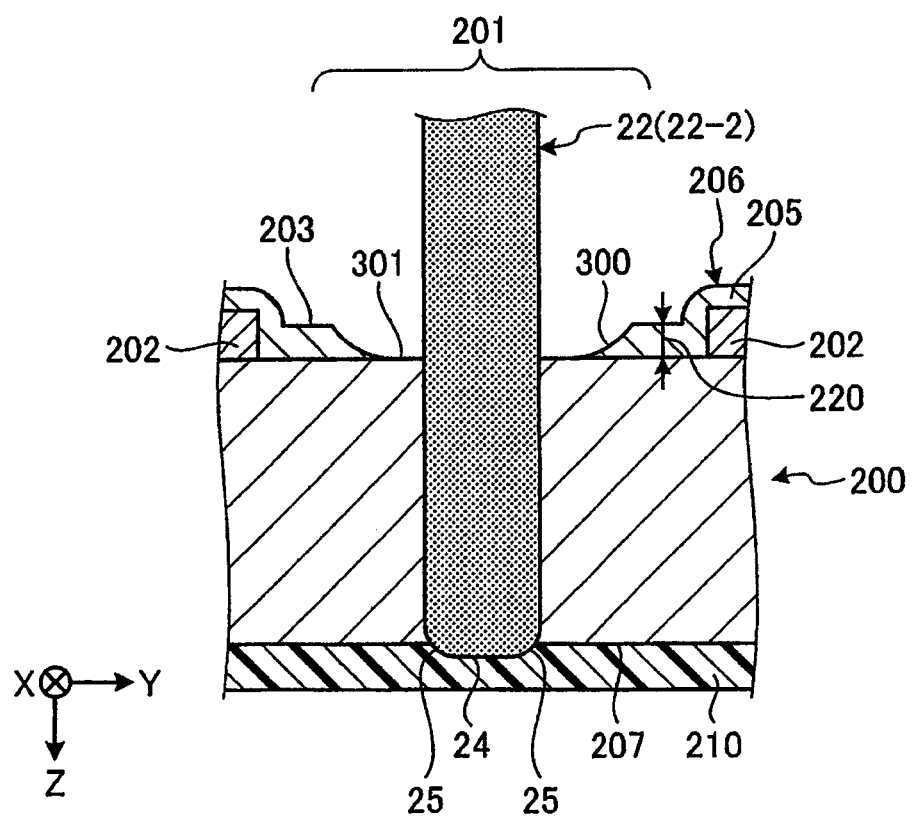
FIG. 13 is a side sectional view depicting a full-cutting step of the wafer processing method illustrated in FIG. 7.
Figure 14:
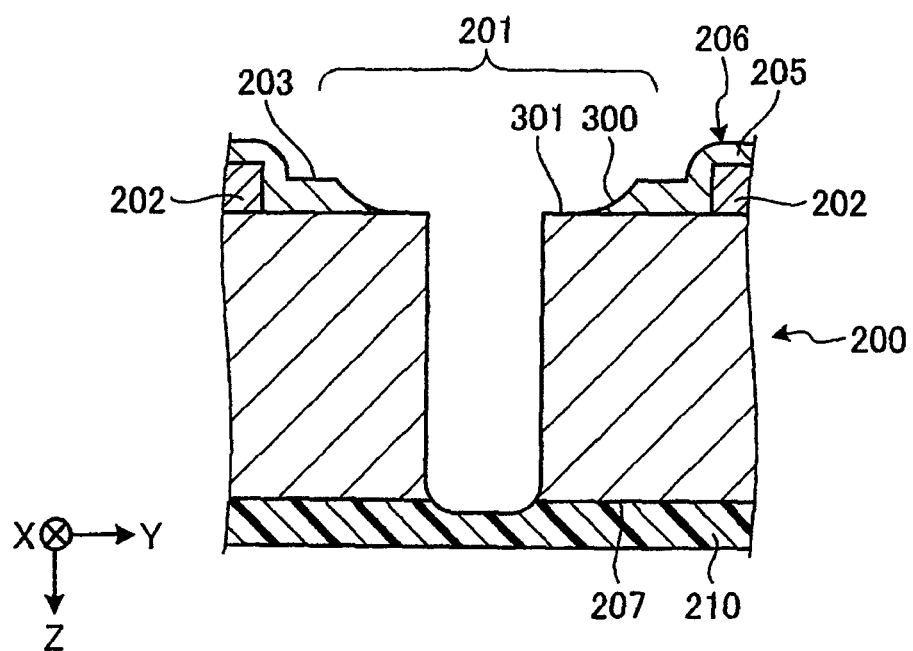
FIG. 14 is a sectional view of part of the wafer after the full-cutting step of the wafer processing method depicted in FIG. 7.

FIG. 13 is a side sectional view depicting the full-cutting step in the wafer processing method illustrated in FIG. 7. FIG. 14 is a sectional view of part of the wafer after the full-cutting step of the wafer processing method illustrated in FIG. 7.

The full-cutting step ST5 is a step of causing the cutting blade 22-2 to cut into the groove bottoms 301 of the cut grooves 300, to divide the wafer 200 into individual devices 202. In the full-cutting step ST5, the control unit 100 relatively moves the street 201 and the cutting blade 22-2 along the street 201, based on the results of alignment, to cause the cutting blade 22-2 to cut into the groove bottom 301 of each cut groove 300 until the cutting blade 22-2 reaches the dicing tape 210. When the cutting blade 22-2 has been made to cut into the groove bottoms 301 of the cut grooves 300 formed in all the streets 201, the control unit 100 finishes the full-cutting step ST5.

After the full-cutting step ST5, the control unit 100 moves the cutting units 20-1 and 20-2 upward, causes the X-axis moving unit 50 to move the chuck table 10 toward the cassette 81, and releases the suction holding at the chuck table 10 and the clamping of the annular frame 211 by the clamp sections 14. The control unit 100 causes the carrying unit to carry the cut wafer 200 from the chuck table 10 to the cleaning unit 90, causes the cleaning unit 90 to clean the wafer 200, and causes the carrying unit to accommodate the wafer 200 into the cassette 81. Then, the control unit 100 sequentially performs the holding step ST1, the measurement step ST2, the region-basis height setting step ST3, the cutting step ST4, and the full-cutting step ST5 for all the wafers 200 in the cassette 81.

According to the wafer processing method and the cutting apparatus 1 of Embodiment 1, in the measurement step ST2, the wafer 200 is partitioned into the plurality of regions 500, and measurement data obtained by measurement of the surface height of the streets 201 at a plurality of measurement positions 403 are sorted on the basis of each region 500. According to the wafer processing method and the cutting apparatus 1, in the region-basis height setting step ST3, the lowest surface height selected from the plurality of surface heights measured in the measurement step ST2 on the basis of each region 500 is set as the surface height of each region 500. According to the wafer processing method and the cutting apparatus 1, in the cutting step ST4, the cutting blade 22-1 is made to cut into the layered body 206, based on the surface height set in the region-basis height setting step ST3, to form the cut grooves 300. Therefore, according to the wafer processing method and the cutting apparatus 1, the cut grooves 300 are formed based on the surface height at the position where the TEG 204 as a structure is not formed, which ensures that at the time of forming the cut groove 300, the cut groove 300 in such a depth that the substrate can be exposed to the side of the front surface 203 in the street 201 can be formed, without preliminarily registering the positions of the TEGs 204. As a result, the wafer processing method and the cutting apparatus 1 have an effect that at the time of forming the cut grooves 300, the layered body 206 including the low dielectric constant insulator film 205 can be restrained from remaining on the streets 201, without preliminarily registering the positions of the TEGs 204.

Note that according to the wafer processing method of the aforementioned embodiment, the following cutting apparatus is obtained.

<Appendix 1>

A cutting apparatus for forming cut grooves by a cutting blade in streets of a wafer provided on a front surface thereof with the streets and a plurality of devices, the streets formed in a grid pattern and partly formed with a structure, the cutting apparatus including:

a chuck table adapted to hold a back surface side of the wafer by a holding surface;

a cutting unit having the cutting blade;

a moving unit adapted to relatively move the cutting unit and the chuck table;

a measurement unit adapted to measure a surface height of the wafer held by the chuck table; and a control unit adapted to control each of components, in which the control unit partitions the front surface of the wafer held by the chuck table into a plurality of regions, causes the measurement unit to measure the surface heights of the streets in each of the regions, sets a lowest surface height in each region as the surface height of the wafer in each region, and forms the cut grooves in the front surface of the wafer while setting a tip position of the cutting blade cutting into the wafer on the basis of each region, based on the set surface heights of the wafer.

The cutting apparatus, like the wafer processing method according to the embodiment, partitions the wafer into the plurality of regions, measures the surface heights of the streets at a plurality of measurement positions on the basis of each region, and sets the lowest surface height on a region basis which is selected from among the plurality of surface heights measured by the measurement unit as a surface height of each region. In addition, the cutting apparatus causes the cutting blade to cut into the layered body, based on the set surface heights, to form the cut grooves. Therefore, the cutting apparatus forms the cut grooves based on the surface height at a position where the structure is not provided, which has an effect that at the time of forming the cut grooves, the layered body including the low dielectric constant insulting film can be restrained from remaining on the streets, without preliminarily registering the position of the structure.

Note that the present invention is not limited to the above-described embodiment. The present invention can be carried out with various modifications without departing from the gist of the invention. While the surface heights of all the streets 201 have been measured on the basis of the predetermined interval 402 in the measurement step ST2 in the aforementioned embodiment, the surface heights of all the streets 201 may not necessarily be measured in the present invention. In the present invention, for example, the surface heights of the streets 201 may be measured at least one street 201 apart in the measurement step ST2.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for forming cut grooves by a cutting blade in streets of a wafer provided on a front surface thereof with the streets and a plurality of devices, the streets formed in a grid pattern and partly formed with a structure, the wafer processing method comprising:

a holding step of holding a back surface side of the wafer by a holding surface of a chuck table;

a measurement step of partitioning the front surface of the wafer held by the chuck table into a plurality of regions and measuring surface heights of the streets in each of regions, wherein each region includes part of at least two streets;

a region-basis height setting step of setting a lowest surface height in each region as a surface height of the wafer in each region, after the measurement step is performed; and a cutting step of forming cut grooves in the front surface of the wafer while setting, on a region basis, a tip position of the cutting blade cutting into the wafer, based on the surface height of the wafer set in the region-basis height setting step.

2. The wafer processing method according to claim 1, wherein a layered body including a low dielectric constant insulator film is layered on the front surface of the wafer, and the streets and the devices are formed by the layered body.

3. The wafer processing method according to claim 1, wherein the region includes part of four streets.

4. The wafer processing method according to claim 1, wherein the measuring surface heights of the streets includes a plurality of measurement positions at predetermined intervals along each street.

5. The wafer processing method according to claim 4, wherein the lowest surface height in each region is based on the plurality of measurement positions measuring the height of part of the at least two streets in each region.

* * * * *